US006800420B2

(12) United States Patent
Song et al.

(10) Patent No.: US 6,800,420 B2
(45) Date of Patent: Oct. 5, 2004

(54) PHOTOSENSITIVE THICK FILM COMPOSITION

(75) Inventors: Tsing-Tang Song, Ilan (TW);
Weir-Torn Jiang, Taipei (TW);
Shung-Jim Yang, Taoyuan (TW);
Sheng-Min Wang, Hsinchu (TW);
Kom-Bei Shiu, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/309,205

(22) Filed: Dec. 4, 2002

(65) Prior Publication Data

US 2003/0162128 A1 Aug. 28, 2003

(30) Foreign Application Priority Data

Dec. 31, 2001 (TW) ........................................ 90133439 A

(51) Int. Cl.$^7$ ........................... G03C 1/725; G03C 1/73; G03F 7/028; G03F 7/033

(52) U.S. Cl. ................................. 430/281.1; 430/285.1; 430/910; 430/916; 430/311; 430/319; 430/922; 430/924; 430/925

(58) Field of Search ........................... 430/281.1, 285.1, 430/910, 916, 311, 319, 922, 924, 925

(56) References Cited

U.S. PATENT DOCUMENTS

| | | | | |
|---|---|---|---|---|
| 5,972,564 A | * | 10/1999 | Kawana et al. | 430/281.1 |
| 6,518,453 B1 | * | 2/2003 | Sutoris et al. | 560/205 |
| 2001/0033219 A1 | * | 10/2001 | Iha et al. | 336/90 |
| 2003/0143486 A1 | * | 7/2003 | Kubota et al. | 430/281.1 |

* cited by examiner

Primary Examiner—Mark F. Huff
Assistant Examiner—Sin J. Lee
(74) Attorney, Agent, or Firm—Sughrue Mion, PLLC

(57) ABSTRACT

A photosensitive thick film composition. The photosensitive thick film composition can produce electrode material with high resolution and high contrast. The photosensitive thick film composition includes an acrylic copolymer, a photoinitiator, a reactive monomer, a conductive metal, glass powder, an additive, and an organic solvent.

45 Claims, No Drawings

PHOTOSENSITIVE THICK FILM COMPOSITION

BACKGROUND OF THE INVENTION

1. Field of the Invention

The present invention relates to a photosensitive thick film composition, and more particularly to a photosensitive thick film composition suitable for use in producing electrodes with high resolution and high contrast.

2. Background of the Invention

In optotronic industry, the popular processes for producing electrode material used for large flat panel displays can be classified into thin film process and thick film process. The thin film process mainly uses sputtering, chemical vapor deposition (CVD), or physical vapor deposition (PVD) to form multi-layered electrode, such as Cr/Cu/Cr, Al/Cr, Cr/Ni, or Cr/Ag. The thick film process mainly uses photolithography or screen printing. However, in the thin film process, since Cu is oxidized easily in the deposition process, it is required to form a Cr/Cu/Cr three-layered electrode. Moreover, since the expansion coefficients of Cr and Cu are different, during high temperature sintering, cracks are easily generated at the interface. Moreover, light reflects on Cr, so the contrast decreases. The thin film process has the above-mentioned drawbacks and the integral facilities and process are complicated, thus increasing the production cost. Therefore, the present trend is to use the simpler thick film process.

In the thick film process, the resolution using screen printing has achieved to 60–70 μm in the present time. Nevertheless, the improvement in resolution using screen printing is limited in the future. The process of using photolithography technique to form the photosensitive thick film of electrodes is very simple and results in high resolution. Also, Cu oxidation will not occur. Therefore, the thick film process by photolithography technique has extensively drawn the industry's attention. There is still a need to develop a photosensitive thick film material with superior properties.

SUMMARY OF THE INVENTION

The first object of the present invention is to provide a photosensitive thick film composition that can produce electrode material with high resolution and high contrast.

To achieve the object, the photosensitive thick film composition includes the following components:

(A) an acrylic copolymer having the repeating unit represented by formula (I)

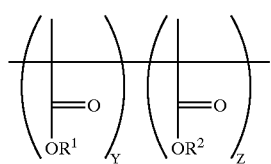

wherein
R$^1$ and R$^2$ are independently hydrogen, C$_{1-20}$ linear or branched alkyl, C$_{3-20}$ cyclic or polycyclic alkyl, C$_{1-6}$ linear, branched, or cyclic alkoxy, silyl, or C$_{1-6}$ alkylsilane, and only one of R$^1$ and R$^2$ is hydrogen, the molar ratio of Y to Z is 0.15–0.7:0.15–0.7;

(B) a photoinitiator;
(C) a reactive monomer;
(D) a conductive metal;
(E) glass powder;
(F) an additive; and
(G) an organic solvent;
wherein components (B), (C), (D), (E), (F), and (G) are present in weight ratios of 10–50:40–90:400–800:20–90:0.1–0.8:90–180 based on 100 weight parts of component (A).

The second object of the present invention is to provide another photosensitive thick film composition that can produce electrode material with high resolution and high contrast.

To achieve the object, the photosensitive thick film composition includes the following components:

(A) an acrylic copolymer having the repeating unit represented by formula (II)

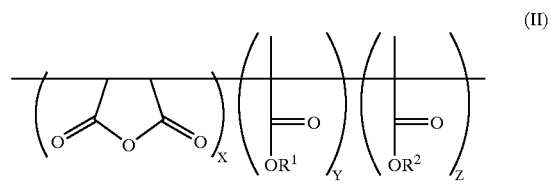

wherein
R$^1$ and R$^2$ are independently hydrogen, C$_{1-20}$ linear or branched alkyl, C3-20 cyclic or polycyclic alkyl, C$_{1-6}$ linear, branched, or cyclic alkoxy, silyl, or C$_{1-6}$ alkylsilane, and only one of R$^1$ and R$^2$ is hydrogen,
the molar ratio of X, Y to Z is 0.01–0.5:0.15–0.7:0.15–0.7;

(B) a photoinitiator;
(C) a reactive monomer;
(D) a conductive metal;
(E) glass powder;
(F) an additive; and
(G) an organic solvent;
wherein components (B), (C), (D), (E), (F), and (G) are present in weight ratios of 10–50:40–90:400–800:20–90:0.1–0.8:90–180 based on 100 weight parts of component (A).

DETAILED DESCRIPTION OF THE INVENTION

The first photosensitive thick film composition of the present invention includes (A) an acrylic copolymer, (B) a photoinitiator; (C) a reactive monomer; (D) a conductive metal; (E) glass powder; (F) an additive; and (G) an organic solvent.

The acrylic copolymer (A) has the repeating unit represented by formula (I)

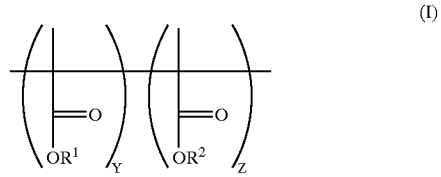

wherein $R^1$ and $R^2$ are independently hydrogen, $C_{1-20}$ linear or branched alkyl, $C_{3-20}$ cyclic or polycyclic alkyl, $C_{1-6}$ linear, branched, or cyclic alkoxy, silyl, or $C_{1-6}$ alkylsilane, and only one of $R^1$ and $R^2$ is hydrogen. The molar ratio of Y to Z is preferably 0.15–0.7:0.15–0.7.

The silyl or alkylsilane can be one of the following groups

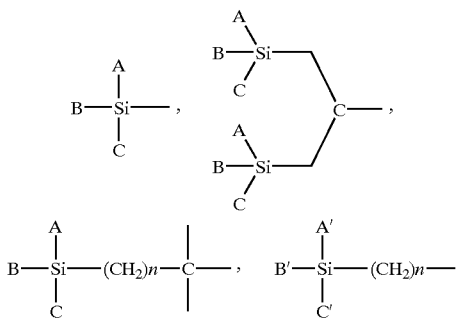

wherein A, B, C, A', B', and C' are the same or different and are independently $C_{1-6}$ linear or branched alkyl, alkoxy, or silyl; and n is an integer of 1 to 6. Preferably, A, B, and C are the same and are trimethylsilyl or trimethoxysilyl, and A', B' and C' are the same and are trimethylsilyl or trimethoxysilyl.

Representative examples of the repeating unit of formula (I) include repeating units derived from

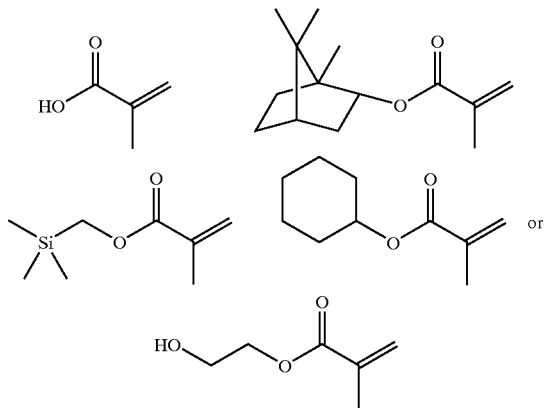

The acrylic copolymer (A) can be dissolved in an organic solvent. The acrylic copolymer (A) preferably has a weight average molecular weight (Mw) of 4000 to 100000, most preferably 10000 to 25000. The acid value is preferably 50 to 180 mg KOH/g, most preferably 90 to 130 mg KOH/g.

The photoinitiator (B) suitable for use in the present invention can be benzoin compounds, acetophenone compounds, anthraquinone compounds, thioxanthone compounds, or acetophenone dimethyl ketal compounds. A representative example of the benzoin compound is benzoin methyl ether. Representative examples of the acetophenone compound include 2,2-dimethoxy-2-phenyl acetophenone and 1,1-dichloro acetonphenone. A representative example of the anthraquinone compound is 2-methyl anthraquinone.

The photoinitiator (B) is preferably present in an amount of 10–50 weight parts, most preferably 25–40 weight parts, based on 100 weight parts of the acrylic copolymer (A).

The reactive monomer (C) accelerates the cross-linking extent in the exposed area during the exposure procedure. Representative examples include 2-hydroxylethyl acrylate, diethylene glycol diacrylate, triethylene glycol diacrylate, pentaerthritol triacrylate, dipentaerthritol triacrylate, trimethylol propane triacrylate, and ethoxylated trimethylol propane triacrylate.

The reactive monomer (C) is preferably used in an amount of 40–90 weight parts, most preferably 55–80 weight parts, based on 100 weight parts of the acrylic copolymer (A).

The condutive metal (D) can be Au, Ag, Ni, or Al. The conductive metal can be used in different shapes, such as ball, sheet, or block. The diameter is preferably 0.1 to 5 $\mu$m. In addition, before use, the conductive metal (D) is preferably treated with a fatty acid such as oleic acid, linoleic acid, or stearic acid.

Preferably, the photosensitive thick film composition of the present invention further includes a silver complex. The silver complex can be $Ag(ER_3)X$, $Ag_2(ER_2(CH_2)_nER_2)X_2$ or $Ag_2(NN)X_2$, wherein E is N, P, or As; R is alkyl, aryl, H, Cl, Br, or I; X is $NO_3^-$, $ClO_4^-$, $SO_4^-$, $BF_4^-$, $BPh_4^-$, $PF_6^-$, $CF_3CO_2^-$, or $CF_3SO_3^-$; n is an integer of 0 to 10; and NN is 2,2'-bipyridine or 1,10-phenanthroline.

The conductive metal (D) is preferably used in an amount of 400–800 weight parts, most preferably 550–700 weight parts, based on 100 weight parts of the acrylic copolymer (A).

The glass powder (E) can include at least four of the following nine ingredients: PbO, $B_2$, $SiO_2$, $Al_2O_3$, BaO, ZnO, $TiO_2$, $Bi_2O_3$, and MgO. Preferably, the glass powder (E) has a glass transition temperature of 300–500° C., and a thermal expansion coefficient $\alpha_{300}$ of 70–90×10$^{-7}$/° C.

The glass powder (E) is preferably used in an amount of 20–90 weight parts, most preferably 40–70 weight parts, based on 100 weight parts of the acrylic copolymer (A).

The additive (F) can be inorganic phosphoric acid compounds or organic phosphoric acid compounds. Representative examples of the inorganic phosphoric acid compound include phosphoric acid and phosphorous acid. An representative example of the organic phosphoric acid compound is mono (2-methacryloyloxyethyl) acid phosphate.

The additive (F) is preferably used in an amount of 0.1–0.8 weight parts, most preferably 0.3–0.6 weight parts, based on 100 weight parts of the acrylic copolymer (A).

Dispersants, defoaming agents, or antioxidants can be added to the additive (F) according to requirements.

The organic solvent (G) can be at least one component of ethylene glycol ether precursors, aromatic hydrocarbons, and ketones. That is to say, the organic solvent (G) can be a single or a mixed organic solvent. Representative examples of the ethylene glycol ether precursor include carbitol, carbitol acetate, and propylene glycol methyl ether acetate. Representative examples of the aromatic hydrocarbon include toluene, xylene, and tetramethylbenzene. Representative examples of ketone include methyl isobutyl ketone, methyl ethyl ketone, and cyclohexenone.

The organic solvent (G) is preferably used in an amount of 90–180 weight parts, most preferably 100–150 weight parts, based on 100 weight parts of the acrylic copolymer (A).

The second photosensitive thick film composition of the present invention includes (A) an acrylic copolymer; (B) a photoinitiator; (C) a reactive monomer; (D) a conductive metal; (E) glass powder; (F) an additive; and (G) an organic solvent. Components (B), (C), (D), (E), (F), and (G) are generally the same as those used in the above-mentioned first photosensitive thick film composition of the present invention, and detailed descriptions are omitted to prevent redundance.

The acrylic copolymer (A) used in the second photosensitive thick film composition is different from that used in the first photosensitive thick film composition and has the repeating unit represented by formula (II)

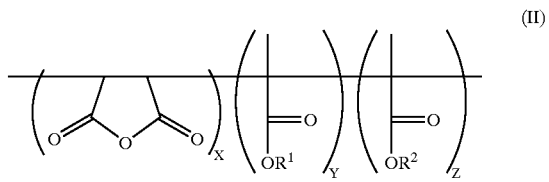

wherein $R^1$ and $R^2$ are independently hydrogen, $C_{1-20}$ linear or branched alkyl, $C_{3-20}$ cyclic or polycyclic alkyl, $C_{1-6}$ linear, branched, or cyclic alkoxy, silyl, or $C_{1-6}$ alkylsilane, and only one of $R^1$ and $R^2$ is hydrogen. Preferably, the molar ratio of X, Y to Z is 0.01–0.5:0.15–0.7:0.15–0.7.

The silyl or alkylsilane can be one of the following groups

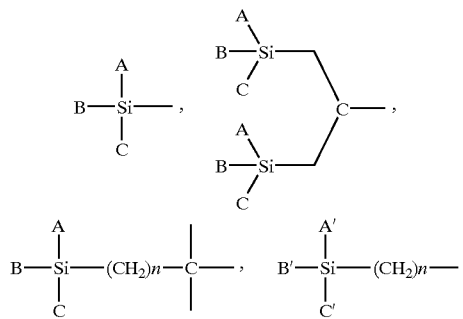

wherein A, B, C, A', B', and C' are the same or different and are independently $C_{1-6}$ linear or branched alkyl, alkoxy, or silyl; and n is an integer of 1 to 6. Preferably, A, B, and C are the same and are trimethylsilyl or trimethoxysilyl, and A', B' and C' are the same and are trimethylsilyl or trimethoxysilyl.

Representative examples of the repeating unit in formula (II) include repeating units derived from

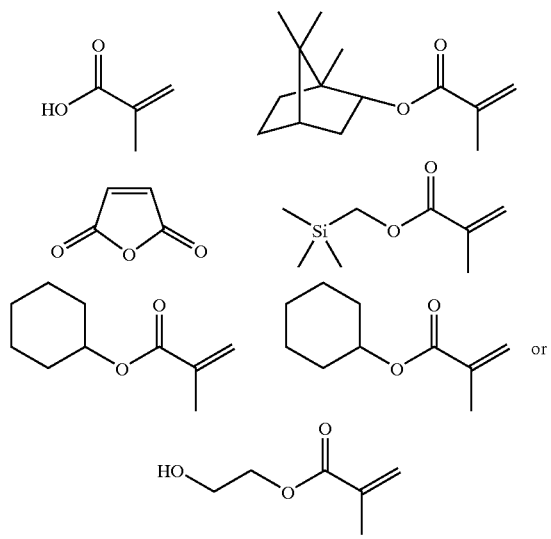

The acrylic copolymer (A) can be dissolved in an organic solvent. The acrylic copolymer (A) preferably has a weight average molecular weight (Mw) of 4000 to 100000, most preferably 10000 to 25000. The acid value is preferably 50 to 180 mg KOH/g, most preferably 90 to 130 mg KOH/g.

The photosensitive thick film composition of the present invention can produce desired electrode circuits by photolithography. First, the photosensitive thick film composition of the present invention is coated on a substrate (such as glass substrate). The coated substrate is then dried at a predetermined temperature (about 120–150° C.), exposed with radiation, developed, dried, and sintered to obtain the desired electrode circuits.

As described above, the photosensitive thick film composition of the present invention can produce single layer electrodes by photolithography. The process and facilities required are simple. The product cost can be decreased. In addition, the electrodes formed have high contrast and high resolution, and good adhesion to the bottom substrate (such is as glass substrate).

The following examples are intended to illustrate the process and the advantages of the present invention more fully without limiting its scope, since numerous modifications and variations will be apparent to those skilled in the art.

Synthesis of Monomer for Acrylic Copolymer 300 mmol of Methylacrylic acid (MAA) and 200 mmol of chloromethyl trimethylsilane were dissolved in 400 ml of dimethylamide. Potassium carbonate was added to the solution and heated to 90° C. and stirred for 5 hours. Next, the reaction solution was filtered. The filtrate was added to a sodium hydrogen carbonate solution, extracted with ether and pure water respectively, dried, filtered, and concentrated to obtain trimethylsilanylmethyl methylacrylate (TMSA) having the formula (i) below

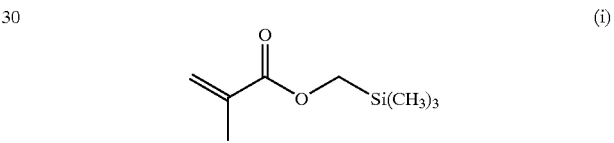

Preparation of Acrylic Copolymer

EXAMPLE 1

Resin A 100 mmol of MAA, 100 mmol of maleic anhydride (MA), and 100 mmol of isobornyl acrylate (IBA) were dissolved in a trace amount of carbitol under nitrogen. The reaction solution was added dropwise to a carbitol solution containing AIBN (2,2-azobisisobutyronitrile) as free radical initiator at 70° C. within one hour, and stirred continuously for 2 hours. The reaction mixture was then heated to 120° C and stirred for 3 hours to terminate the free radical reaction. Finally, the temperature was decreased to 100° C., and tetrabutylammonium bromide (TBAB) was added. The reaction proceeded for 12 hours to obtain Resin A solution containing about 45% of solid content. The weight average molecular weight (Mw) of Resin A was determined to 30000, and the acid value was 73 mg KOH/g. The ingredient amounts and results are summarized in Table 1.

EXAMPLE 2

Resin B 100 mmol of MAA, 100 mmol of MA, 100 mmol of TMSA, and 100 mmol of IBA were dissolved in a trace amount of carbitol under nitrogen. The reaction solution was added dropwise to a carbitol solution containing AIBN (2,2-azobisisobutyronitrile) as free radical initiator at 70° C. within one hour, and stirred continuously for 2 hours. The reaction mixture was then heated to 120° C. and stirred for 3 hours to terminate the free radical reaction. Finally, the temperature was decreased to 100° C., and 100 mmol of glycidyl methacrylate (GMA) and TBAB were added. The reaction proceeded for 12 hours to obtain Resin B solution containing about 45% of solid content. The weight average molecular weight (Mw) of Resin B was determined to 35000, and the acid value was 60 mg KOH/g. The ingredient amounts and results are summarized in Table 1.

EXAMPLE 3
Resin C 700 mmol of MAA and 300 mmol of cyclohexyl acrylate (CHA) were dissolved in a trace amount of carbitol under nitrogen. The reaction solution was added dropwise to a carbitol solution containing AIBN (2,2-azobisisobutyronitrile) as free radical initiator at 70° C. within one hour, and stirred continuously for 2 hours. The reaction mixture was then heated to 120° C. and stirred for 3 hours to terminate the free radical reaction. Finally, the temperature was decreased to 100° C., and 300 mmol of GMA and TBAB were added. The reaction proceeded for 12 hours to obtain Resin C solution containing about 45% of solid content. The weight average molecular weight (Mw) of Resin C was determined to 53000, and the acid value was 120 mg KOH/g. The ingredient amounts and results are summarized in Table 1.

EXAMPLE 4
Resin D 400 mmol of MAA, 120 mmol of TMSA, and 80 mmol of IBA were dissolved in a trace amount of carbitol under nitrogen. The reaction solution was added dropwise to a carbitol solution containing AIBN (2,2-azobisisobutyronitrile) as free radical initiator at 70° C. within one hour, and stirred continuously for 2 hours. The reaction mixture was then heated to 120° C. and stirred for 3 hours to terminate the free radical reaction. Finally, the temperature was decreased to 100° C., and 190 mmol of GMA and TBAB were added. The reaction proceeded for 12 hours to obtain Resin D solution containing about 45% of solid content. The weight average molecular weight (Mw) of Resin D was determined to 12000, and the acid value was 110 mg KOH/g. The ingredient amounts and results are summarized in Table 1.

EXAMPLE 5
Resin E 350 mmol of MAA and 150 mmol of IBA were dissolved in a trace amount of carbitol under nitrogen. The reaction solution was added dropwise to a carbitol solution containing AIBN (2,2-azobisisobutyronitrile) as free radical initiator at 70° C. within one hour, and stirred continuously for 2 hours. The reaction mixture was then heated to 120° C. and stirred for 3 hours to terminate the free radical reaction. Finally, the temperature was decreased to 100° C., and 150 mmol of GMA and TBAB were added. The reaction proceeded for 12 hours to obtain Resin E solution containing about 45% of solid content. The weight average molecular weight (Mw) of Resin E was determined to 14000, and the acid value was 150 mg KOH/g. The ingredient amounts and results are summarized in Table 1.

TABLE 1

| Resin Monomer | Resin A (mmol) | Resin B (mmol) | Resin C (mmol) | Resin D (mmol) | Resin E (mmol) |
| --- | --- | --- | --- | --- | --- |
| MAA | 100 | 100 | 700 | 400 | 350 |
| MA | 100 | 100 | | | |
| CHA | | | 300 | | |
| TMSA | | 100 | | 120 | |
| IBA | 100 | 20 | | 80 | 150 |
| GMA | | 100 | 300 | 190 | 150 |
| Mw | 30000 | 35000 | 53000 | 12000 | 14000 |
| Acid value (mg KOH/g) | 73 | 60 | 120 | 110 | 150 |

Preparation of Photosensitive Thick Film Composition

EXAMPLE 6

Resin A solution obtained from Example 1 was filtered with a 325 mesh filter at 80° C. and then cooled. Then, 26.5 weight parts of Resin A, 0.36 weight parts of 2-isopropyl-9H-thioxanthen-9-one (ITX), 1.43 weight parts of 2-methyl-4'-(methylthio)-2-morpholinopropiophenone (hereinafter referred to 907), 4.3 weight parts of trimethylolpropane triacrylate (hereinafter referred to 351), and 0.04 weight parts of formic acid were mixed and dissolved. 63.8 weight parts of silver powder AgC-152 (average particle size= 0.2–0.4 μm) and 3.5 weight parts of glass powder were added. Then, the mixture was ground with a three roller mill to obtain the photosensitive thick film composition A' of the present invention. Suitable amounts of solvent can be added to adjust the viscosity of the photosensitive thick film composition A'.

In addition, before use, the above-mentioned AgC-152 was washed with a mixed solution of isopropanol/water (1/1) containing 1% of linoleic acid. The weight percentage ratio of silver powder and the mixed solution was 4:1. Then, the silver powder was filtered and dried for use. Glass powder can be glass powder GF-31 or glass powder GF-811. Glass powder GF-31 is constituted of 55% of PbO, 20% of $B_2O_3$, 15% of $SiO_2$, 5% of $Al_2O_3$, and 5% of $Bi_2O_3$, and the average particle size is 2 μm. Glass powder GF-811 is constituted of 50% of PbO, 15% of $B_2O_3$, 15% of $SiO_2$, 5% of $Al_2O_3$, 5% of BaO, and 10% of ZnO, and the average particle size is 2.5 μm.

EXAMPLE 7

Resin B solution obtained from Example 2 was filtered with a 325 mesh filter at 80° C. and then cooled. Then, 22.2 weight parts of Resin B, 0.4 weight parts of ITX, 1.6 weight parts of 907, 3.6 weight parts of 351 were mixed and dissolved. 59.0 weight parts of silver powder AgC-152 (average particle size =0.2–0.4 μm) and 3.9 weight parts of glass powder were added. Then, the mixture was ground with a three roller mill to obtain the photosensitive thick film composition B' of the present invention. Suitable amounts of solvent can be added to adjust the viscosity of the photosensitive thick film composition B'.

In addition, before use, the above-mentioned AgC-152 was washed with a mixed solution of isopropanol/water (1/1) containing 1% of linoleic acid. The weight percentage ratio of silver powder and the mixed solution was 4:1. Then, the silver powder was filtered and dried for use. Glass powder can be glass powder GF-31 or glass powder GF-811. Glass powder GF-31 is constituted of 55% of PbO, 20% of B203, 15% of $SiO_2$, 5% of Al203, and 5% of Bi203, and the average particle size is 2 μm. Glass powder GF-811 is constituted of 50% of PbO, 15% of B203, 15% of $SiO_2$, 5% of Al203, 5% of BaO, and 10% of ZnO, and the average particle size is 2.5 μm.

EXAMPLE 8

Resin C solution obtained from Example 3 was filtered with a 325 mesh filter at 80° C. and then cooled. Then, 10.4 weight parts of Resin C, 0.61 weight parts of ITX, 2.45 weight parts of 907, 10.8 weight parts of ethoxylated trimethylol propane triacrylate (hereinafter referred to 454), and 1.0 weight parts of 351 were mixed and dissolved. 62.5 weight parts of silver powder AgC-101 (average particle size=0.1–1 μm), 9.0 weight parts of silver complex, and 3.12 weight parts of glass powder were added. Then, the mixture was ground with a three roller mill to obtain the photosensitive thick film composition C' of the present invention. Suitable amounts of solvent can be added to adjust the viscosity of the photosensitive thick film composition C'.

In addition, before use, the above-mentioned AgC-101 was washed with a mixed solution of isopropanol/water (1/1) containing 1% of linoleic acid. The weight percentage ratio of silver powder and the mixed solution was 4:1. Then, the silver powder was filtered and dried for use. Glass powder can be glass powder GF-31 or glass powder GF-811. Glass powder GF-31 is constituted of 55% of PbO, 20% of $B_2O_3$, 15% of $SiO_2$, 5% of $Al_2O_3$, and 5% of $Bi_2O_3$, and the average particle size is 2 μm. Glass powder GF-811 is constituted of 50% of PbO, 15% of $B_2O_3$, 15% of $SiO_2$, 5% of $Al_2O_3$, 5% of BaO, and 10% of ZnO, and the average particle size is 2.5 μm.

EXAMPLE 9

Resin D solution obtained from Example 4 was filtered with a 325 mesh filter at 80° C. and then cooled. Then, 24 weight parts of Resin D, 0.6 weight parts of ITX, 2.4 weight parts of 907, 7.2 weight parts of 351, and 0.03 weight parts of phosphoric acid were mixed and dissolved. 62 weight parts of silver powder AgC-101 (average particle size=0.1–1 μm) and 3.8 weight parts of glass powder were added. Then, the mixture was ground with a three roller mill to obtain the photosensitive thick film composition D' of the present invention. Suitable amounts of solvent can be added to adjust the viscosity of the photosensitive thick film composition D'.

In addition, before use, the above-mentioned AgC-101 was washed with a mixed solution of isopropanol/water (1/1) containing 1% of linoleic acid. The weight percentage ratio of silver powder and the mixed solution was 4:1. Then, the silver powder was filtered and dried for use. Glass powder can be glass powder GF-31 or glass powder GF-811. Glass powder GF-31 is constituted of 55% of PbO, 20% of B2O3, 15% of SiO2, 5% of Al2O3, and 5% of Bi2O3, and the average particle size is 2 μm. Glass powder GE-811 is constituted of 50% of PbO, 15% of B2O3, 15% of $SiO_2$, 5% of Al2O3, 5% of BaO, and 10% of ZnO, and the average particle size is 2.5 μm.

EXAMPLE 10

Resin D solution obtained from Example 4 was filtered with a 325 mesh filter at 80° C. and then cooled. Then, 23.6 weight parts of Resin D, 0.8 weight parts of ITX, 3.5 weight parts of 907, 4.3 weight parts of 351, and 3.9 weight parts of BYK-P 104S available from BYK company (dispersant) were mixed and dissolved. 60.5 weight parts of silver powder AgC-113 (average particle size–0.1–1 μm) and 3.5 weight parts of glass powder were added. Then, the mixture was ground with a three roller mill to obtain the photosensitive thick film composition D" of the present invention. Suitable amounts of solvent can be added to adjust the viscosity of the photosensitive thick film composition D".

In addition, before use, the above-mentioned AgC-101 was washed with a mixed solution of isopropanol/water (1/1) containing 1% of linoleic acid. The weight percentage ratio of silver powder and the mixed solution was 4:1. Then, the silver powder was filtered and dried for use. Glass powder can be glass powder GF-31 or glass powder GF-811. Glass powder GF-31 is constituted of 55% of PbO, 20% of $B_2O_3$, 15% of $SiO_2$, 5% of $Al_2O_3$, and 5% of $Bi_2O_3$, and the average particle size is 2 μm. Glass powder GF-811 is constituted of 50% of PbO, 15% of $B_2O_3$, 15% of $SiO_2$, 5% of $Al_2O_3$, 5% of BaO, and 10% of ZnO, and the average particle size is 2.5 μm.

EXAMPLE 11

Resin E solution obtained from Example 5 was filtered with a 325 mesh filter at 80° C. and then cooled. Then, 26.7 weight parts of Resin E, 0.3 weight parts of ITX, 1.2 weight parts of 907, and 2.4 weight parts of 351 were mixed and dissolved. 65.5 weight parts of silver powder AgC-113 (average particle size=0.1–1 μm) and 3.6 weight parts of glass powder were added. Then, the mixture was ground with a three roller mill to obtain the photosensitive thick film composition E' of the present invention. Suitable amounts of solvent can be added to adjust the viscosity of the photosensitive thick film composition E'.

In addition, before use, the above-mentioned AgC-113 was washed with a mixed solution of isopropanol/water (1/1) containing 1% of linoleic acid. The weight percentage ratio of silver powder and the mixed solution was 4:1. Then, the silver powder was filtered and dried for use. Glass powder can be glass powder GF-31 or glass powder GF-811. Glass powder GF-31 is constituted of 55% of PbO, 20% of $B_2O_3$, 15% of $SiO_2$, 5% of $Al_2O_3$, and 5% of $Bi_2O_3$, and the average particle size is 2 μm. Glass powder GF-811 is constituted of 50% of PbO, 15% of $B_2O_3$, 15% of $SiO_2$, 5% of $Al_2O_3$, 5% of BaO, and 10% of ZnO, and the average particle size is 2.5 μm.

Photolithographic Evaluation of Photosensitive Thick Film Composition

Photosensitive thick film compositions A', B', C', D', D", and E' were coated onto ITO glass respectively. The film was baked at 80° C. for 5 to 10 minutes, and then exposed with a high pressure mercury lamp scattering exposure machine. After exposure, the sample was developed with 0.1 N sodium hydrogen carbonate solution for 20 to 40 seconds, rinsed with deionized water, and dried to obtain an exposed pattern. The results are shown in Table 2.

TABLE 2

| Thick film composition | A' | B' | C' | D' | D" | E' |
|---|---|---|---|---|---|---|
| Film thickness (μm) | 10 | 12 | 18 | 17 | 16 | 16 |
| Exposure Energy (mJ/cm$^2$) | 480 | 500 | 360 | 180 | 160 | 180 |
| Resolution (mil) | 3 | 3 | 3 | <2 | <2 | 2 |

From the results of Table 2, it can be seen that the exposed pattern using the photosensitive thick film composition of the present invention had good resolution and the photosensitive thick film composition could resolve line-and-space patterns (L/S patterns) as small as less smaller than 50/μm.

The above sample was placed in a sintering furnace and heated to 450° C. at a rate of 5° C./min, maintained at 450° C. for 30 minutes, and then heated to 520° C. at a rate of 5° C./min. The heat treatment could remove organic compounds in the photosensitive thick film composition, thus forming a conductive electrode. The conductive electrode exhibited good conductivity and small resistance (about $2\times10^{-4}$ ohms). Also, the conductive electrode had good film properties and good adhesion to the ITO bottom layer.

In conclusion, the photosensitive thick film composition of the present invention can form single layer electrodes by photolithography technique. The process and facilities required are simple, and the production cost can be effectively decreased. In addition, the electrode obtained has high contrast and high resolution, and has good adhesion to the bottom substrate (such as glass substrate).

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A photosensitive thick film composition, comprising the following components:
   (A) an acrylic copolymer having the repeating unit represented by formula (I)

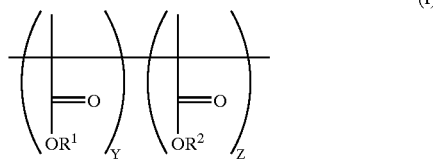

(I)

wherein
   $R^1$ and $R^2$ are independently hydrogen, $C_{1-20}$ linear or branched alkyl, $C_{3-20}$ cyclic or polycyclic alkyl, $C_{1-6}$ linear, branched, or cyclic alkoxy, silyl, or $C_{1-6}$ alkylsilane, and only one of $R^1$ and $R^2$ is hydrogen, the molar ratio of Y to Z is 0.15–0.7:0.15–0.7;
   (B) a photoinitiator;
   (C) a reactive monomer;
   (D) a conductive metal;
   (E) glass powder;
   (F) an additive; and
   (G) an organic solvent; and
   (H) a silver complex comprising $Ag(ER_3)X$, $Ag_2(ER_2(CH_2)_nER_2)X_2$ or $Ag_2(NN)X_2$,
   wherein
   E is N, P, or As;
   R is alkyl, aryl, H, Cl, Br, or I;
   X is $NO_3-$, $ClO_4-$, $BF_4-$, $BPh_4-$, $PF_6-$, $CF_3CO_2-$, or $CF_3SO_3-$;
   n is an integer of 0 to 10: and
   NN is 2,2'-bipyridine or 1,10-phenanthroline;
   wherein components (B), (C), (D), (E), (F), and (G) are present in weight ratios of 10–50:40–90:400–800:20–90:0.1–0.8:90–180 based on 100 weight parts of component (A).

2. The photosensitive thick film composition as claimed in claim 1, wherein the silyl or alkylsilane is one of the following groups

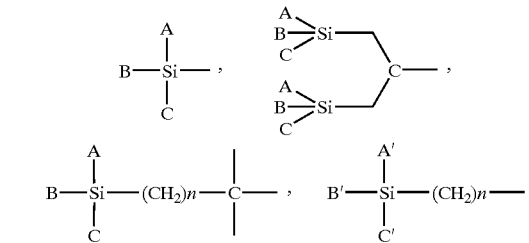

wherein
A, B, C, A', B', and C' are the same or different and are independently $C_{1-6}$ linear or branched alkyl, alkoxy, or silyl; and
n is an integer of 1 to 6.

3. The photosensitive thick film composition as claimed in claim 2, wherein A, B, and C are the same and are trimethylsilyl or trimethoxysilyl, and A', B' and C' are the same and are trimethylsilyl or trimethoxysilyl.

4. The photosensitive thick film composition as claimed in claim 1, wherein the repeating unit of formula (I) is derived from

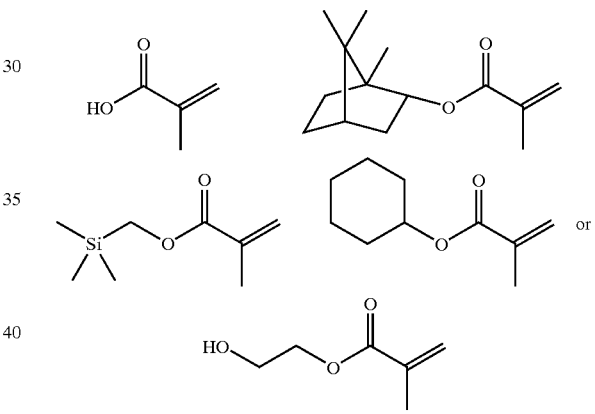

5. The photosensitive thick film composition as claimed in claim 1, wherein the acrylic copolymer (A) has a weight average molecular weight (Mw) of 4000 to 100000 and an acid value of 50 to 180 mg KOH/g.

6. The photosensitive thick film composition as claimed in claim 1, wherein the acrylic copolymer (A) has a weight average molecular weight (Mw) of 10000 to 25000 and an acid value of 90 to 130 mg KOH/g.

7. The photosensitive thick film composition as claimed in claim 1, wherein the photoinitiator (B) is benzoin compounds, acetophenone compounds, anthraquinone compounds, thioxanthone compounds, or acetophenone dimethyl ketal compounds.

8. The photosensitive thick film composition as claimed in claim 7, wherein the benzoin compound is benzoin methyl ether.

9. The photosensitive thick film composition as claimed in claim 7, wherein the acetophenone compound is 2,2-dimethoxy-2-phenyl acetophenone or 1,1-dichloro acetonphenone.

10. The photosensitive thick film composition as claimed in claim 7, wherein the anthraquinone compound is 2-methyl anthraquinone.

11. The photosensitive thick film composition as claimed in claim 1, wherein the reactive monomer (C) is 2-hydroxylethyl acrylate, diethylene glycol diacrylate, triethylene glycol diacrylate, pentaerthritol triacrylate, dipentaerthritol triacrylate, trimethylol propane triacrylate, or ethoxylated trimethylol propane triacrylate.

12. The photosensitive thick film composition as claimed in claim 1, wherein the conductive metal (D) is Au, Ag, Ni, or Al.

13. The photosensitive thick film composition as claimed in claim 12, wherein the conductive metal (D) is treated with a fatty acid.

14. The photosensitive thick film composition as claimed in claim 13, wherein the fatty acid is oleic acid, linoleic acid, or stearic acid.

15. The photosensitive thick film composition as claimed in claim 1, wherein the glass powder (E) includes at least four of the following nine ingredients: PbO, $B_2O_3$, $SiO_2$, $Al_2O_3$, BaO, ZnO, $TiO_2$, $Bi_2O_3$, and MgO.

16. The photosensitive thick film composition as claimed in claim 1, wherein the additive (F) is inorganic phosphoric acid compounds or organic phosphoric acid compounds.

17. The photosensitive thick film composition as claimed in claim 16, wherein the inorganic phosphoric acid compound is phosphoric acid or phosphorous acid.

18. The photosensitive thick film composition as claimed in claim 16, wherein the organic phosphoric acid compound is mono(2-methacryloyloxyethyl)acid phosphate.

19. The photosensitive thick film composition as claimed in claim 1, wherein the organic solvent (G) is at least one component of ethylene glycol ether precursors, aromatic hydrocarbons, and ketones.

20. The photosensitive thick film composition as claimed in claim 19, wherein the ethylene glycol ether precursor is carbitol, carbitol acetate, or propylene glycol methyl ether acetate.

21. The photosensitive thick film composition as claimed in claim 19, wherein the aromatic hydrocarbon is toluene, xylene, or tetramethylbenzene.

22. The photosensitive thick film composition as claimed in claim 19, wherein the ketone is methyl isobutyl ketone, methyl ethyl ketone, or cyclohexenone.

23. A photosensitive thick film composition, comprising the following components:

(A) an acrylic copolymer having the repeating unit represented by formula (II)

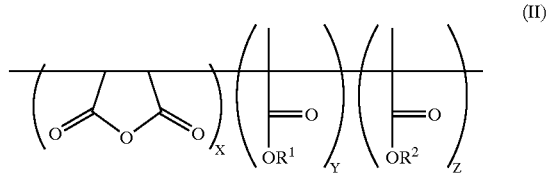

(II)

wherein
R$^1$ and R$^2$ are independently hydrogen, $C_{1-20}$ linear or branched alkyl, $C_{3-20}$ cyclic or polycyclic alkyl, $C_{1-6}$ linear, branched, or cyclic alkoxy, silyl, or $C_{1-6}$ alkylsilane, and only one of R$^1$ and R$^2$ is hydrogen,
the molar ratio of X, Y to Z is 0.01–0.5:0.15–0.7:0.15–0.7;

(B) a photoinitiator;
(C) a reactive monomer;
(D) a conductive metal;
(E) glass powder;
(F) an additive; and
(G) an organic solvent;
wherein components (B), (C), (D), (B), (F), and (G) are present in weight ratios of 10–50:40–90:400–800:20–90:0.1–0.8:90–180 based on 100 weight parts of component (A).

24. The photosensitive thick film composition as claimed in claim 23, wherein the silyl or alkylsilane is one of the following groups

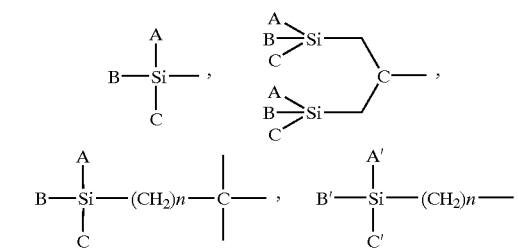

wherein
A, B, C, A', B', and C' are the same or different and are independently $C_{1-6}$ linear or branched alkyl, alkoxy, or silyl; and
n is an integer of 1 to 6.

25. The photosensitive thick film composition as claimed in claim 24, wherein A, B, and C are the same and are trimethylsilyl or trimethoxysilyl, and A', B' and C' are the same and are trimethylsilyl or trimethoxysilyl.

26. The photosensitive thick film composition as claimed in claim 23, wherein the repeating unit in formula (II) is derived from

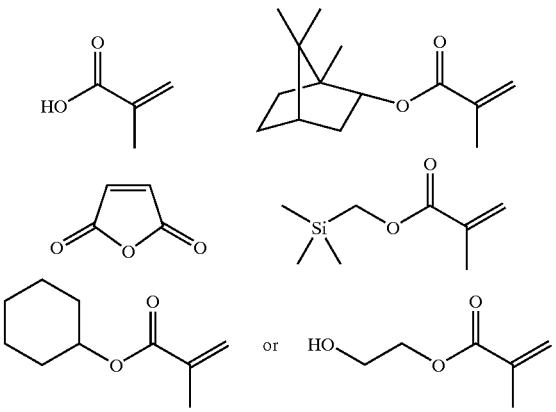

27. The photosensitive thick film composition as claimed in claim 23, wherein the acrylic copolymer (A) has a weight average molecular weight (Mw) of 4000 to 100000 and an acid value of 50 to 180 mg KOH/g.

28. The photosensitive thick film composition as claimed in claim 23, wherein the acrylic copolymer (A) has a weight average molecular weight (Mw) of 10000 to 25000 and an acid value of 90 to 130 mg KOH/g.

29. The photosensitive thick film composition as claimed in claim 23, wherein the photoinitiator (B) is benzoin compounds, acetophenone compounds, anthraquinone compounds, thioxanthone compounds, or acetophenone dimethyl ketal compounds.

30. The photosensitive thick film composition as claimed in claim 29, wherein the benzoin compound is benzoin methyl ether.

31. The photosensitive thick film composition as claimed in claim 29, wherein the acetophenone compound is 2,2-dimethoxy-2-phenyl acetophenone or 1,1-dichloro acetonphenone.

32. The photosensitive thick film composition as claimed in claim 29, wherein the anthraquinone compound is 2-methyl anthraquinone.

33. The photosensitive thick film composition as claimed in claim 23, wherein the reactive monomer (C) is 2-hydroxylethyl acrylate, diethylene glycol diacrylate, triethylene glycol diacrylate, pentaerthritol triacrylate, dipentaerthritol triacrylate, trimethylol propane triacrylate, or ethoxylated trimethylol propane triacrylate.

34. The photosensitive thick film composition as claimed in claim 23, wherein the conductive metal (D) is Au, Ag, Ni, or Al.

35. The photosensitive thick film composition as claimed in claim 34, wherein the conductive metal (D) is treated with a fatty acid.

36. The photosensitive thick film composition as claimed in claim 35, wherein the fatty acid is oleic acid, linoleic acid, or stearic acid.

37. The photosensitive thick film composition as claimed in claim 23, further including a silver complex, and the silver complex is $Ag(ER_3)X$, $Ag_2(ER_2(CH_2)_nER_2)X_2$ or $Ag_2(NN)X_2$,
wherein E is N, P, or As;

R is alkyl, aryl, H, Cl, Br, or I;

X is $NO_3^-$, $ClO_4^-$, $SO_4^-$, $BF_4^-$, $BPh_4^-$, $PF_6^-$, $CF_3CO_2^-$, or $CF_3SO_3^-$;

n is an integer of 0 to 10; and

NN is 2,2'-bipyridine or 1,10-phenanthroline.

38. The photosensitive thick film composition as claimed in claim 23, wherein the glass powder (E) includes at least four of the following nine ingredients: $PbO$, $B_2O_3$, $SiO_2$, $Al_2O_3$, $BaO$, $ZnO$, $TiO_2$, $Bi_2O_3$, and $MgO$.

39. The photosensitive thick film composition as claimed in claim 23, wherein the additive (F) is inorganic phosphoric acid compounds or organic phosphoric acid compounds.

40. The photosensitive thick film composition as claimed in claim 39, wherein the inorganic phosphoric acid compound is phosphoric acid or phosphorous acid.

41. The photosensitive thick film composition as claimed in claim 39, wherein the organic phosphoric acid compound is mono(2-methacryloyloxyethyl)acid phosphate.

42. The photosensitive thick film composition as claimed in claim 23, wherein the organic solvent (G) is at least one component of ethylene glycol ether precursors, aromatic hydrocarbons, and ketones.

43. The photosensitive thick film composition as claimed in claim 42, wherein the ethylene glycol ether precursor is carbitol, carbitol acetate, or propylene glycol methyl ether acetate.

44. The photosensitive thick film composition as claimed in claim 42, wherein the aromatic hydrocarbon is toluene, xylene, or tetramethylbenzene.

45. The photosensitive thick film composition as claimed in claim 42, wherein the ketone is methyl isobutyl ketone, methyl ethyl ketone, or cyclohexenone.

* * * * *